United States Patent [19]

Onagawa

[11] Patent Number: 5,657,089
[45] Date of Patent: Aug. 12, 1997

[54] VIDEO SIGNAL PROCESSING DEVICE FOR SAMPLING TV SIGNALS TO PRODUCE DIGITAL DATA WITH INTERVAL CONTROL

[75] Inventor: Seiki Onagawa, Tokyo, Japan

[73] Assignee: NEC Corporation, Tokyo, Japan

[21] Appl. No.: 539,060

[22] Filed: Oct. 4, 1995

[30] Foreign Application Priority Data

Oct. 14, 1994 [JP] Japan .................................. 6-249109

[51] Int. Cl.$^6$ .................................. H03M 1/12; H03L 7/00
[52] U.S. Cl. .................................. 348/537; 348/572
[58] Field of Search .................................. 348/572, 536, 348/537, 542, 555, 441, 571, 511

[56] References Cited

U.S. PATENT DOCUMENTS

| | | | |
|---|---|---|---|
| 4,958,228 | 9/1990 | Kutsuki | 348/537 |
| 5,184,091 | 2/1993 | Srivastava | 348/537 |

FOREIGN PATENT DOCUMENTS 1-12691   1/1989   Japan .

*Primary Examiner*—Victor R. Kostak

*Attorney, Agent, or Firm*—Laff, Whitesel, Conte & Saret, Ltd.

[57] ABSTRACT

An effective video interval detector detects an effective video interval of a digital video signal from an A/D converter, and outputs differential data indicative of the difference between the detected effective video interval and a required video data interval. A video signal supply interval controller produces frequency-dividing ratio control data depending on the differential data supplied thereto and supplies the frequency-dividing ratio control data to a programmable frequency divider to vary its frequency-dividing ratio. An output signal frequency from a voltage-controlled oscillator is now controlled to eliminate the difference between the effective video interval and the required video data interval. Even when a video signal supplying device is connected to a video signal source which produces a video signal having a different horizontal synchronizing frequency, the output signal frequency from the voltage-controlled oscillator can be brought into synchronism with the horizontal scanning frequency of the video signal from the video signal source for thereby enabling the A/D converter to sample the effective video interval in a desired number of samples.

5 Claims, 7 Drawing Sheets

VIDEO SIGNAL PROCESSING DEVICE FOR SAMPLING TV SIGNALS TO PRODUCE DIGITAL DATA WITH INTERVAL CONTROL

BACKGROUND OF THE INVENTION

1. Field of the Invention

The present invention relates to a video signal supplying device, and more particularly to a video signal supplying device for sampling a video signal with a sampling clock signal synchronous with a horizontal synchronizing signal separated from the video signal and supplying the sampled video signal as digital data.

2. Description of the Related Art

One conventional video signal supplying device includes a phase-locked loop (PLL) as shown in FIG. 1 of the accompanying drawings. Specifically, the conventional video signal supplying device shown in FIG. 1 comprises a PLL 101 and an A/D converter 102.

The PLL 101 comprises a feedback loop composed of a phase comparator 103 for comparing the phase of a horizontal synchronizing signal separated from a video signal and the phase of an output signal from a frequency divider 106 (described later) and outputting a phase error signal, a low-pass filter (LPF) 104 for passing low-frequency components of the phase error signal from the phase comparator 103, a voltage-controlled oscillator (VCO) 105 for outputting a frequency signal depending on an input control voltage from the LPF 104, and a frequency divider 106 for frequency-dividing an input signal from the VCO 105 at a given frequency-dividing ratio and outputting a frequency-divided signal.

The A/D converter 102 converts an input analog video signal into a digital video signal based on a sampling clock signal supplied from the PLL 101, and outputs the digital video signal.

Operation of the conventional video signal supplying device will be described below.

An analog video signal is supplied to the A/V converter 102. A horizontal synchronizing signal separated from the video signal is supplied to the phase comparator 103. The phase comparator 103 compares the phase of the horizontal synchronizing signal and the phase of a signal indicative of a horizontal scanning frequency from the frequency divider 106, and generates a phase error signal. After high-frequency components of the phase error signal have been attenuated by the LPF 104, the phase error signal is applied as a control signal to the VCO 105 for thereby controlling the frequency of its output signal.

The output signal from the VCO 105 is applied as sampling pulses to the A/D converter 102, and supplied to the frequency divider 106. The frequency divider 106 frequency-divides the supplied signal at a frequency-dividing ratio of 1/m (m is a natural number of 2 or greater), and the frequency-divided signal is supplied as a comparison signal to the phase comparator 103.

In this manner, the PLL 101 reduces any phase error between the phase of the horizontal synchronizing signal and the phase of the output signal from the frequency divider 106, and the VCO 105 outputs pulses which are synchronized in phase with the horizontal synchronizing signal and have a repetition frequency that is m times greater than the horizontal scanning frequency. In the absence of any horizontal synchronizing signal separated from a video signal, the phase error signal becomes nil, and the VCO 105 oscillates at a free-running oscillation frequency.

Another conventional video signal supplying device includes a PLL having a programmable frequency divider as shown in FIG. 2 of the accompanying drawings. Specifically, the conventional video signal supplying device shown in FIG. 2 comprises a PLL 111 having a programmable frequency divider and an A/D converter 112.

The PLL 111 comprises a phase comparator 113 for being supplied with a horizontal synchronizing signal separated from a video signal as a reference input signal, an LPF 114 for converting a phase error signal (differential signal voltage) based on a phase error or difference detected by the phase comparator 113 into a DC voltage, a VCO 115 for controlling an output oscillation frequency based on the DC voltage, and a programmable frequency divider 116 for frequency-dividing the output oscillation frequency from the VCO 115 and supplying the frequency-divided signal as a comparison signal to the phase comparator 113.

The conventional video signal supplying device shown in FIG. 2 differs from the conventional video signal supplying device shown in FIG. 1 in that the output signal frequency of the VCO 115 can be varied depending on the frequency-dividing ratio of the programmable frequency divider 116.

Operation of the conventional video signal supplying device shown in FIG. 2 will be described below. An error signal generated by the phase comparator 113 depending on the phase difference between a horizontal synchronizing signal and an output signal from the programmable frequency divider 116 is converted into a DC voltage by the LPF 114. The DC voltage from the LPF 114 is applied as a control voltage to the VCO 115, thereby varying the output signal frequency thereof. The output signal from the VCO 115 is applied as sampling pulses to the A/D converter 112 and also supplied to the programmable frequency divider 116. The signal supplied to the programmable frequency divider 116 is frequency-divided into a signal which is supplied as a comparison signal to the phase comparator 113.

In this manner, the PLL 111 reduces any phase error between the phase of the horizontal synchronizing signal and the phase of the output signal from the programmable frequency divider 116, and the VCO 115 outputs pulses which are synchronized in phase with the horizontal synchronizing signal. In the absence of any horizontal synchronizing signal separated from a video signal, the phase error signal becomes nil, and the VCO 115 oscillates at a free-running oscillation frequency.

The programmable frequency divider 116 is a frequency divider whose frequency-dividing ratio is variable by a control signal supplied from an input terminal 117. The output signal frequency from the VCO 115 is a frequency depending on the frequency-dividing ratio of the programmable frequency divider 116. Therefore, the output signal frequency from the VCO 115 can be controlled on the frequency-dividing ratio of the programmable frequency divider 116.

The two conventional video signal supplying devices described above pose problems of their own. Specifically, the conventional video signal supplying device shown in FIG. 1 fail to process various video signals having different effective video intervals because the output oscillation frequency of the VCO 105 is fixed. If the conventional video signal supplying device shown in FIG. 1 sampled various video signals having different effective video intervals, video data outputted from the A/D converter 102 would contain unnecessary data, and would not contain necessary data.

The conventional video signal supplying device shown in FIG. 2 is capable of processing various video signals having different effective video intervals by adjusting the frequency-dividing ratio of the programmable frequency divider 116. However, inasmuch as the frequency-dividing ratio needs to be adjusted outside of the PLL 111, the process of adjusting the frequency-dividing ratio has to be carried out each time sources of video signals are changed.

SUMMARY OF THE INVENTION

It is therefore an object of the present invention to provide a video signal supplying device which is capable of supplying video data while adjusting a horizontal video data interval for sampling a video signal so as to match an effective video interval.

Another object of the present invention is to provide a video signal supplying device which is capable of supplying video data containing as many samples as desired.

Still another object of the present invention is to provide a video signal supplying device which is capable of supplying stably video data free of any error between a required video data interval and a sampled effective video interval, without being affected by noise.

According to the present invention, there is provided a video signal supplying device comprising an A/D converter for sampling an analog video signal based on a sampling clock signal and converting the analog video signal into a digital video signal, an effective video interval detector for detecting an effective video interval of the digital video signal outputted from the A/D converter, and outputting differential data representative of the difference between the detected effective video interval and a required video data interval, a phase-locked loop for supplying the A/D converter with a signal, as the sampling clock signal, which is synchronized in phase with a horizontal synchronizing signal separated from the analog video signal and supplied from a voltage-controlled oscillator whose output frequency is variably controlled based on a phase difference between the horizontal synchronizing signal and an output signal from a variable frequency divider, and feeding the signal back to the variable frequency divider, and a video signal supply interval controller for being supplied with the differential data and outputting frequency-dividing ratio data to establish a frequency-dividing ratio for the variable frequency divider in the phase-locked loop.

The video signal supplying device further comprises first setting means for externally establishing and supplying the required video data interval to the effective video interval detector.

Alternatively, the video signal supplying device further comprises second setting means for outputting setting data corresponding a difference between a predetermined effective video interval and the required video data interval, and a switch for selecting one of the differential data from the effective video interval detector and the setting data and outputting the selected one of the data to the video signal supply interval controller.

With the above arrangement, the effective video interval detector determines the difference between the effective video interval of the input video signal and the required video data interval, and varies the frequency-dividing ratio of the variable frequency divider in the phase-locked loop depending on the difference in order to eliminate the difference. Therefore, even if there is an error produced between the required video data interval and the sampled effective video interval when the input analog video signal is sampled, the frequency-dividing ratio of the variable frequency divider and the sampling clock frequency are corrected or varied based on the differential data depending on the error in order to equalize the sampled effective video interval to the required video data interval.

Furthermore, the effective video interval detector is supplied with the required video data interval that has been externally established by the first setting means, so that the required video data interval can be changed to any value that is desired by the user.

Alternatively, the setting data from the second setting means, which corresponds to the difference between the predetermined effective video interval and the required video data interval, rather than output differential data from the effective video interval detector, can be supplied through the switch to the video signal supply interval controller.

The above and other objects, features, and advantages of the present invention will become apparent from the following description with reference to the accompanying drawings which illustrate examples of the present invention.

DETAILED DESCRIPTION OF THE PREFERRED EMBODIMENTS

Figure 1:
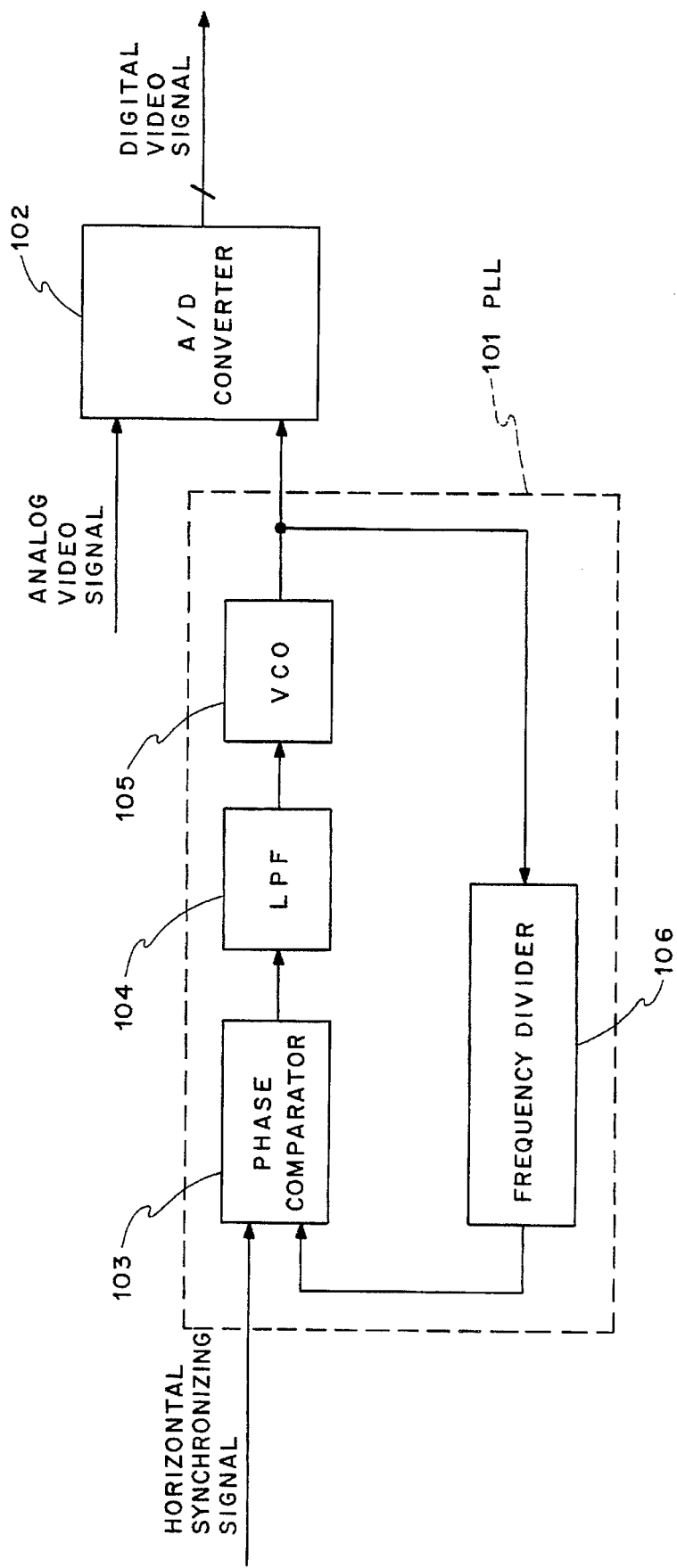
FIG. 1 is a block diagram of a conventional video signal supplying device.
Figure 2:
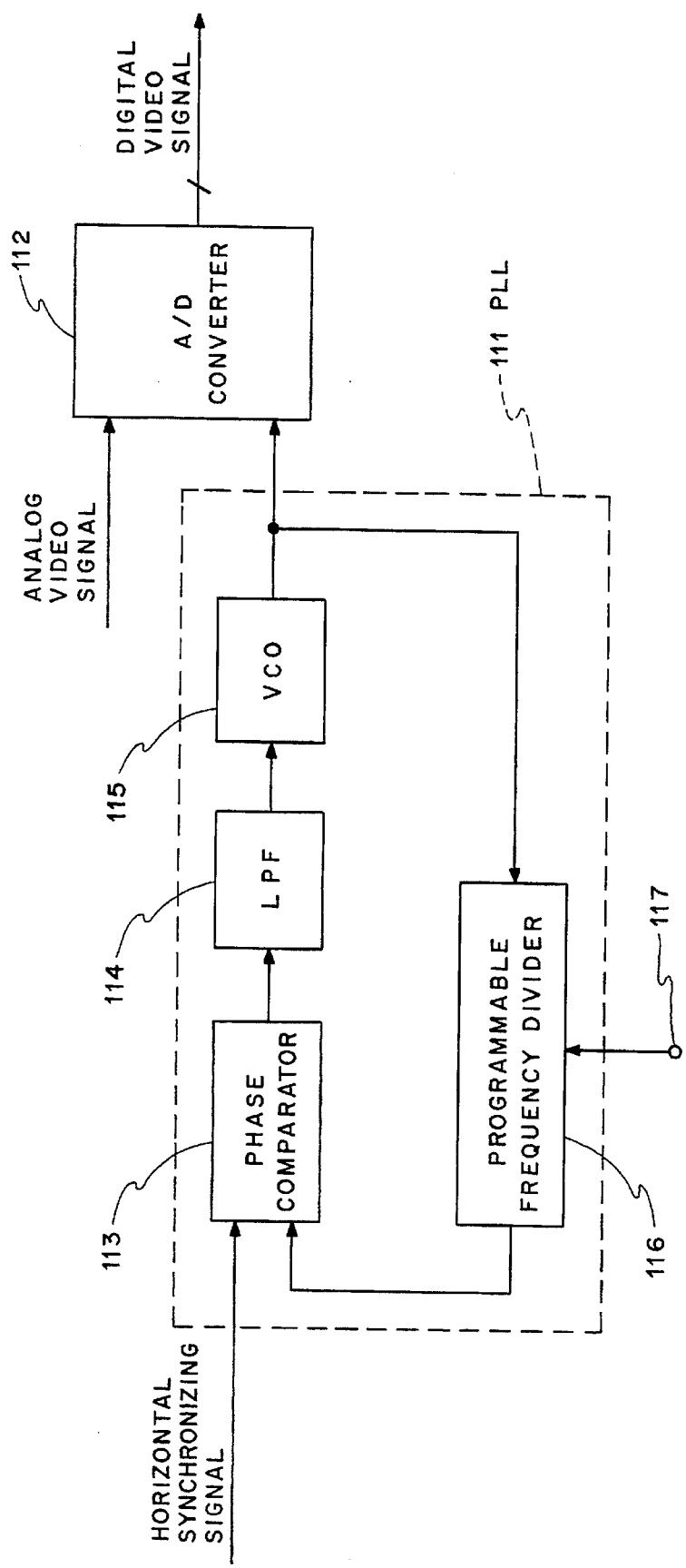
FIG. 2 is a block diagram of another conventional video signal supplying device.
Figure 3:
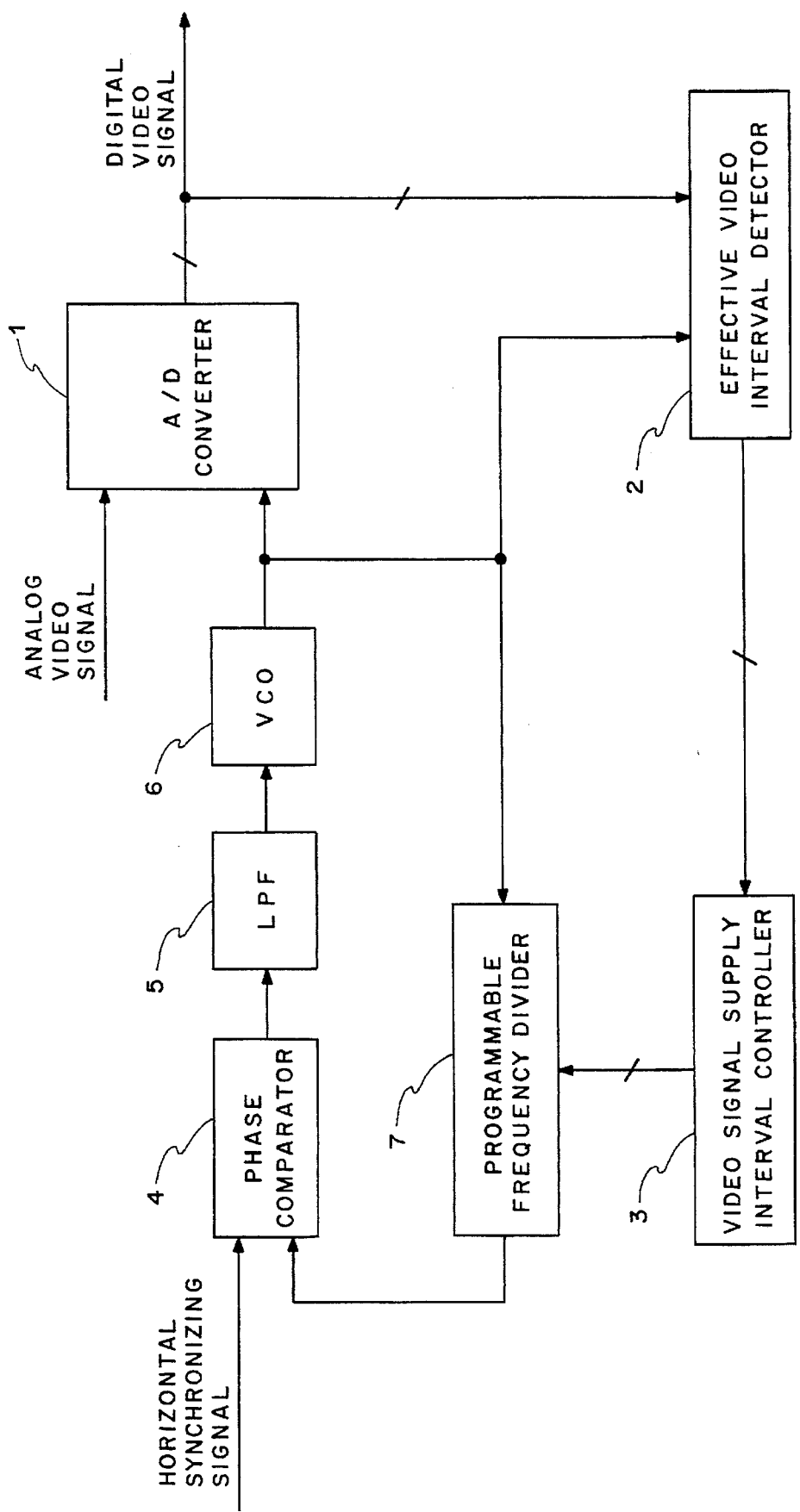
FIG. 3 is a block diagram of a video signal supplying device according to a first embodiment of the present invention.

As shown in FIG. 3, a video signal supplying device according to a first embodiment of the present invention comprises an A/D converter 1, an effective video interval detector 2, a video signal supply interval controller 3, a phase comparator 4, a low-pass filter (LPF) 5, a voltage-controlled oscillator (VCO) 6, and a programmable frequency divider 7. The phase comparator 4, the LPF 5, the VCO 6, and the programmable frequency divider 7 jointly make up a phase-locked loop (PLL).

The A/D converter 1 converts an analog video signal into a digital video signal. The effective video interval detector 2 monitors an output digital video signal from the A/D converter 1 to detect an effective video interval in the video signal. The video signal supply interval controller 3 controls the number of samples in the effective video interval based on a detected output signal from the effective video interval detector 2.

The phase comparator 4 outputs a phase error signal depending on the phase difference between a horizontal synchronizing signal separated from an input video signal and an output signal from the programmable frequency divider 7. The LPF 5 attenuates high-frequency components of the phase error signal. The VCO 6 outputs a signal having a frequency depending on an output signal from the LPF 5 as a sampling clock signal to the A/D converter 1. The programmable frequency divider 7, whose frequency-dividing ratio is variable by an output signal from the video signal supply interval controller 3, supplies an output signal to the phase comparator 4.

Figure 4:
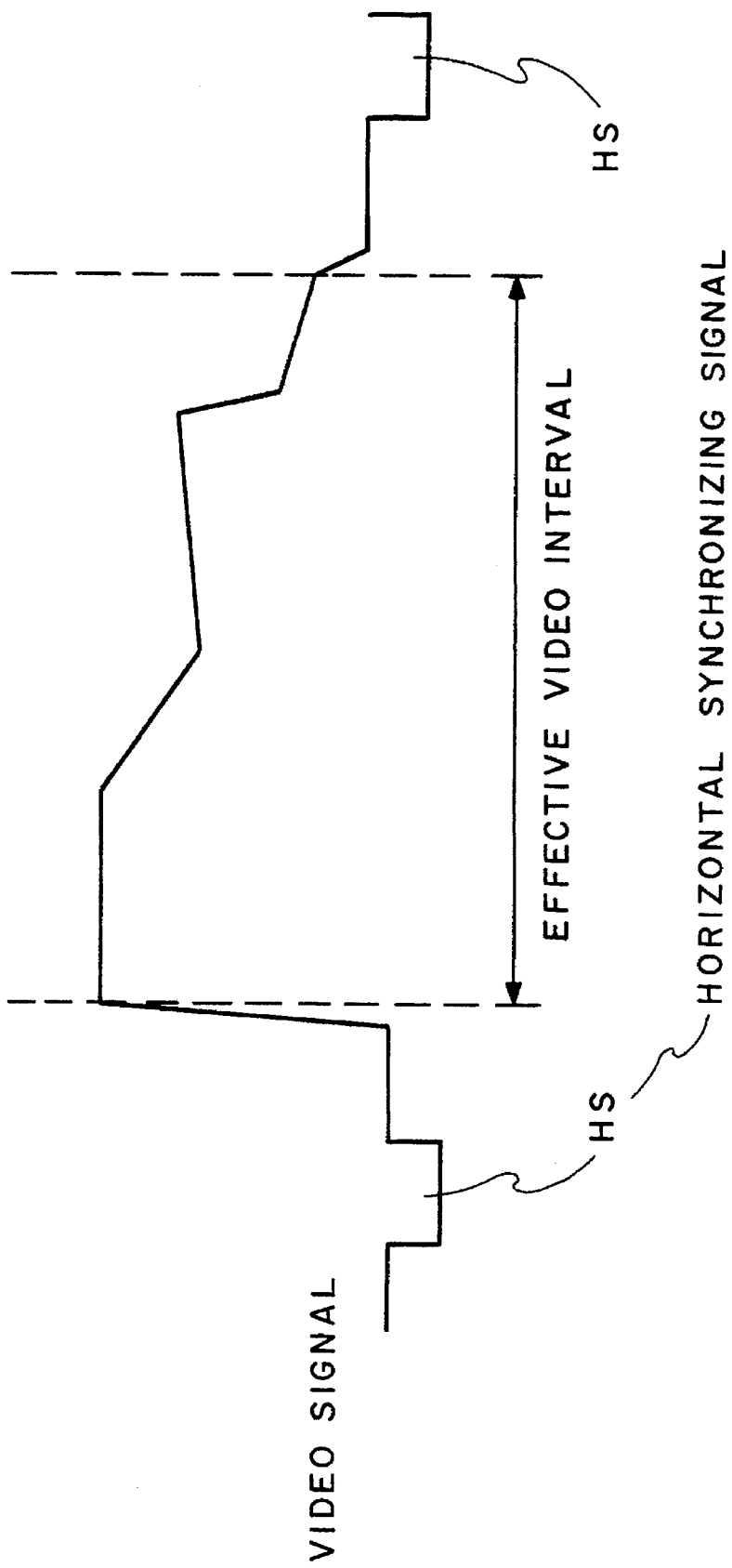
FIG. 4 is a diagram illustrative of an effective video interval.

Operation of the video signal supplying device according to the first embodiment will be described below with reference to FIGS. 3 and 4. FIG. 4 illustrates an effective video interval of a video signal, showing the signal interval of a video signal period between two adjacent horizontal synchronizing signals HS. According to the present invention, the sampling frequency is variably controlled to enable the A/D converter 1 to generate video data having a constant number of samples at all times even when the effective video interval is varied by a selected source of video signals.

The A/D converter 1 samples an input analog video signal with sampling pulses having a frequency which is a multiple of a horizontal scanning frequency generated by the PLL, which is composed of the phase comparator 4, the LPF 5, the VCO 6, and the programmable frequency divider 7, in phase with a horizontal synchronizing signal separated from the input analog video signal, and therefore converts the input analog video signal into a digital video signal (video data).

The effective video interval detector 2 receives the digital video signal as an input signal, detects the effective video interval of the input video signal as shown in FIG. 4, and outputs differential data indicative of the difference between the detected effective video interval and a required video data interval. The differential data is then supplied from the effective video interval detector 2 to the video signal supply interval controller 3, which produces frequency-dividing ratio control data depending on the differential data. The video signal supply interval controller 3 supplies the frequency-dividing ratio control data to the programmable frequency divider 7, thereby varying the frequency-dividing ratio thereof. The output signal frequency of the VCO 6 is now controlled to eliminate the difference between the required video data interval and the effective video interval.

Even when the video signal supplying device is connected to a video signal source having a different horizontal synchronizing signal frequency, the VCO 6 outputs a sampling clock signal in synchronism with a frequency which is an integral multiple of the frequency of the horizontal synchronizing signal of the video signal, so that the video signal supplying device can automatically match itself to the horizontal synchronizing signal of the video signal from the selected video signal source.

Since the programmable frequency divider 7 is employed, the oscillation frequency of the VCO is determined by the frequency (horizontal scanning frequency) of the horizontal synchronizing signal of the video signal which is supplied as the reference input signal to the phase comparator 4, and also by the frequency-dividing ratio of the programmable frequency divider 7, so that the horizontal scanning frequency of the video signal from the video signal source and the output signal frequency of the VCO 6 will be held in synchronism with each other at all times. The frequency-dividing ratio may be selected by setting the effective video interval to a number of samples to be produced.

With the first embodiment of the present invention, even if input analog video signals from various video signal sources have different effective video intervals, the output signal frequency of the VCO 6 is controlled so as to eliminate the difference between the required video data interval and the effective video interval, allowing the effective video interval to be sampled as a desired number of samples.

Figure 5:
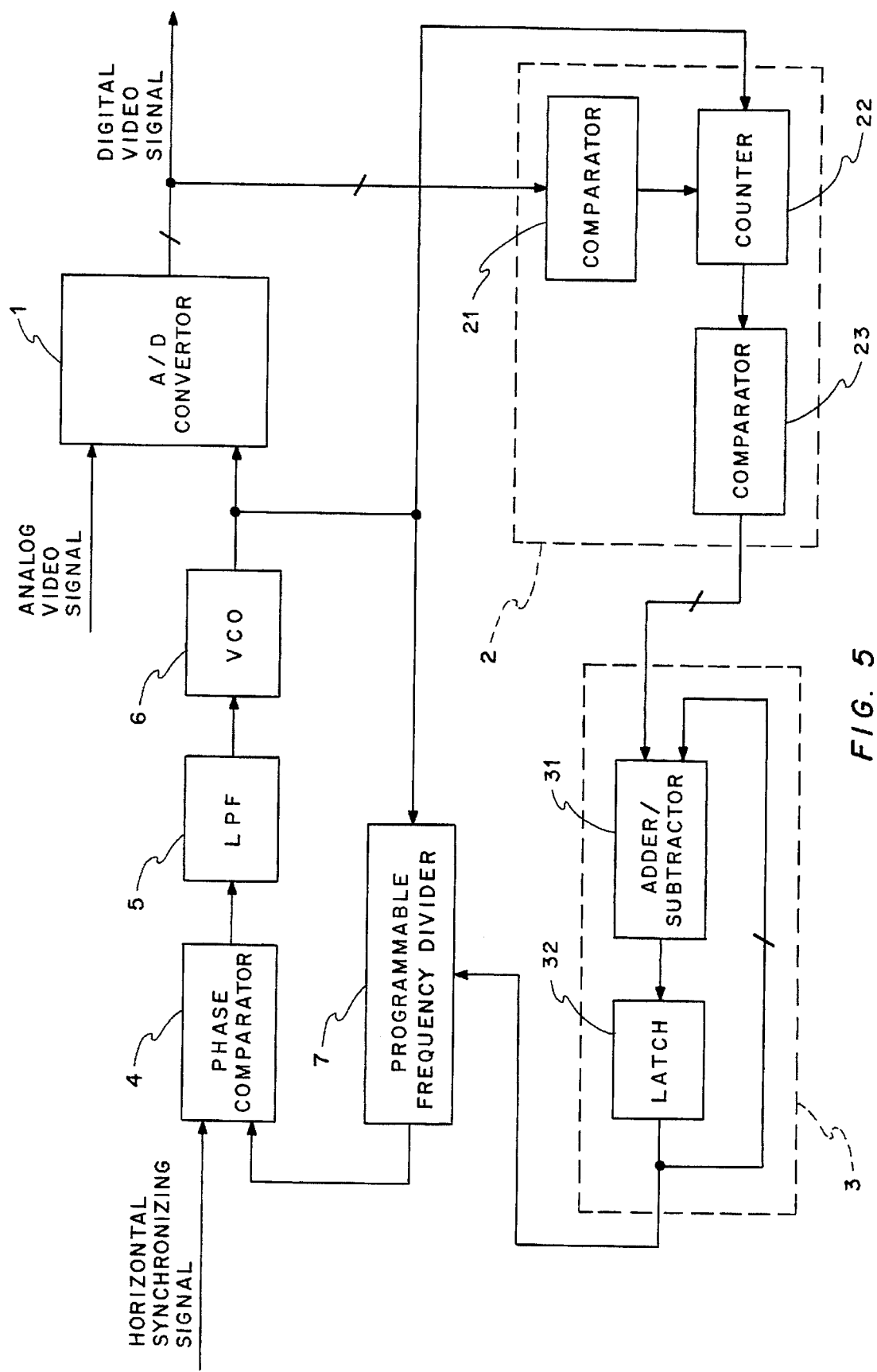
FIG. 5 is a detailed block diagram of the video signal supplying device of FIG. 3 according to the first embodiment of the present invention.

FIG. 5 shows in detail block form the video signal supplying device shown in FIG. 3. Those parts shown in FIG. 5 which are identical to those shown in FIG. 3 are denoted by identical reference numerals, and will not be described in detail below. As shown in FIG. 5, the effective video interval detector 2 comprises a comparator 21 for detecting an effective video signal region and a non-video signal region, a counter 22 for counting pixels in an effective video interval, and a comparator 23 for comparing a required video data interval and an effective video interval and outputting the difference between the required video data interval and the effective video interval that have been compared.

The video signal supply interval controller 3 comprises an adder/subtractor 31 as a calculating circuit for modifying the previous frequency-dividing ratio of the programmable frequency divider 7 with differential data indicative of the difference between the required video data interval and the effective video interval from the effective video interval detector 2, and a latch 32 as a storage circuit for establishing the frequency-dividing ratio of the programmable frequency divider 7 based on the result of calculations by the adder/subtractor 31.

The video signal supplying device shown in FIG. 5 operates as follows: An output digital video signal from the A/D converter 1 is supplied to the comparator 21 which compares the digital video signal with a reference signal level to determine whether the digital video signal belongs to an effective video signal region or a non-video signal region, and outputs a status signal indicative of whether the digital video signal belongs to an effective video signal region or a non-video signal region. If the digital video signal belongs to an effective video signal region, then the status signal is of a high level, and if the digital video signal belongs to a non-video signal region, then the status signal is of a low level.

The counter 22 is supplied with the status signal and also the output signal from the VCO 6 as clock pulses. The counter 22 counts clock pulses as long as the status signal is of a high level. Therefore, the counter 22 outputs a count indicative of the number of samples (the number of pixels) in the effective video signal region, and supplies the count to the comparator 23. The comparator 23 compares the count indicative of the number of samples (the number of pixels) in the effective video signal region with a preset required video data interval, and outputs differential data to one of the input terminals of the adder/subtractor 31.

The other input terminal of the adder/subtractor 31 is supplied with an output signal from the latch 32, i.e., data indicative of the previous frequency-dividing ratio of the programmable frequency divider 7. Therefore, the adder/subtractor 31 outputs data representing the previous frequency-divining ratio of the programmable frequency divider 7 modified by the differential data from the comparator 23, and supplies the data to the latch 32. The latch 32 now outputs frequency-dividing ratio control data for adjusting the frequency-dividing ratio of the programmable frequency divider 7 in a direction to eliminate the difference between the required video data interval and the effective video interval.

According to the first embodiment, therefore, if there is an error produced between the required video data interval and the effective video interval of the input video signal that is sampled, the frequency-dividing ratio of the programmable frequency divider 7 is automatically adjusted or corrected depending on the error. Consequently, the A/D converter 1 can generate video data composed of a constant number of samples with no difference between the required video data interval and the effective video interval.

Figure 6:
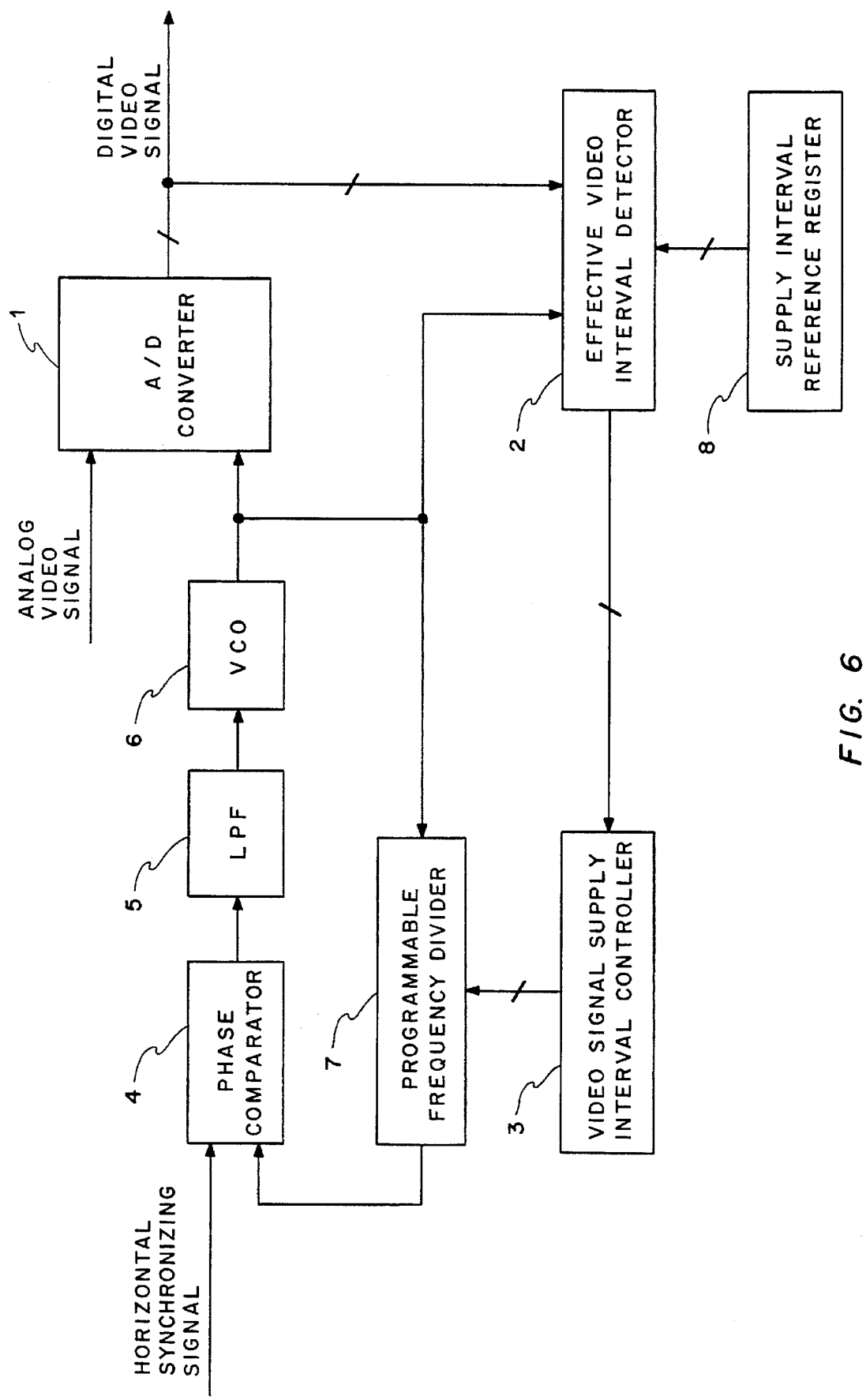
FIG. 6 is a block diagram of a video signal supplying device according to a second embodiment of the present invention.

FIG. 6 shows a video signal supplying device according to a second embodiment of the present invention. Those parts shown in FIG. 6 which are identical to those shown in FIGS. 3 and 5 are denoted by identical reference numerals, and will not be described in detail below. The video signal supplying device according to the second embodiment of the present invention resides in that it additionally includes an supply interval reference register 8 for establishing an supply interval for the effective video interval detector 2.

In the first embodiment shown in FIGS. 3 and 5, the number of samples in an effective video interval in the effective video interval detector 2 with respect to a video signal to be supplied is of a fixed value related to a required video data interval. The video signal supplying device according to the first embodiment is therefore incapable of handling a plurality of numbers of samples in an effective video interval. According to the second embodiment, the number of samples in an effective video interval can be varied by the supply interval reference register 8.

Operation of the video signal supplying device according to the second embodiment will be described below. A digital video signal outputted from the A/D converter 1 is supplied to the effective video interval detector 2. After the effective video interval of the digital video signal has been detected by the effective video interval detector 2, the detected count of the effective video interval is compared with a required video data interval from the supply interval reference register 8 by the comparator 23 shown in FIG. 5.

Since the required video data interval from the supply interval reference register 8 is variable as desired, the differential data outputted from the comparator 23 is representative of a value depending on the required video data interval from the supply interval reference register 8. The differential data is supplied through the video signal supply interval controller 3 to the programmable frequency divider 7 to control the frequency-dividing ratio thereof for eliminating the differential data.

Thus, the number of samples in the effective video interval of the analog video signal that is supplied to the A/D converter 1 is varied into a value which depends on the required video data interval from the supply interval reference register 8. According to the second embodiment, therefore, the need for a plurality of numbers of samples in an effective video interval can be met by varying the setting in the supply interval reference register 8.

Figure 7:
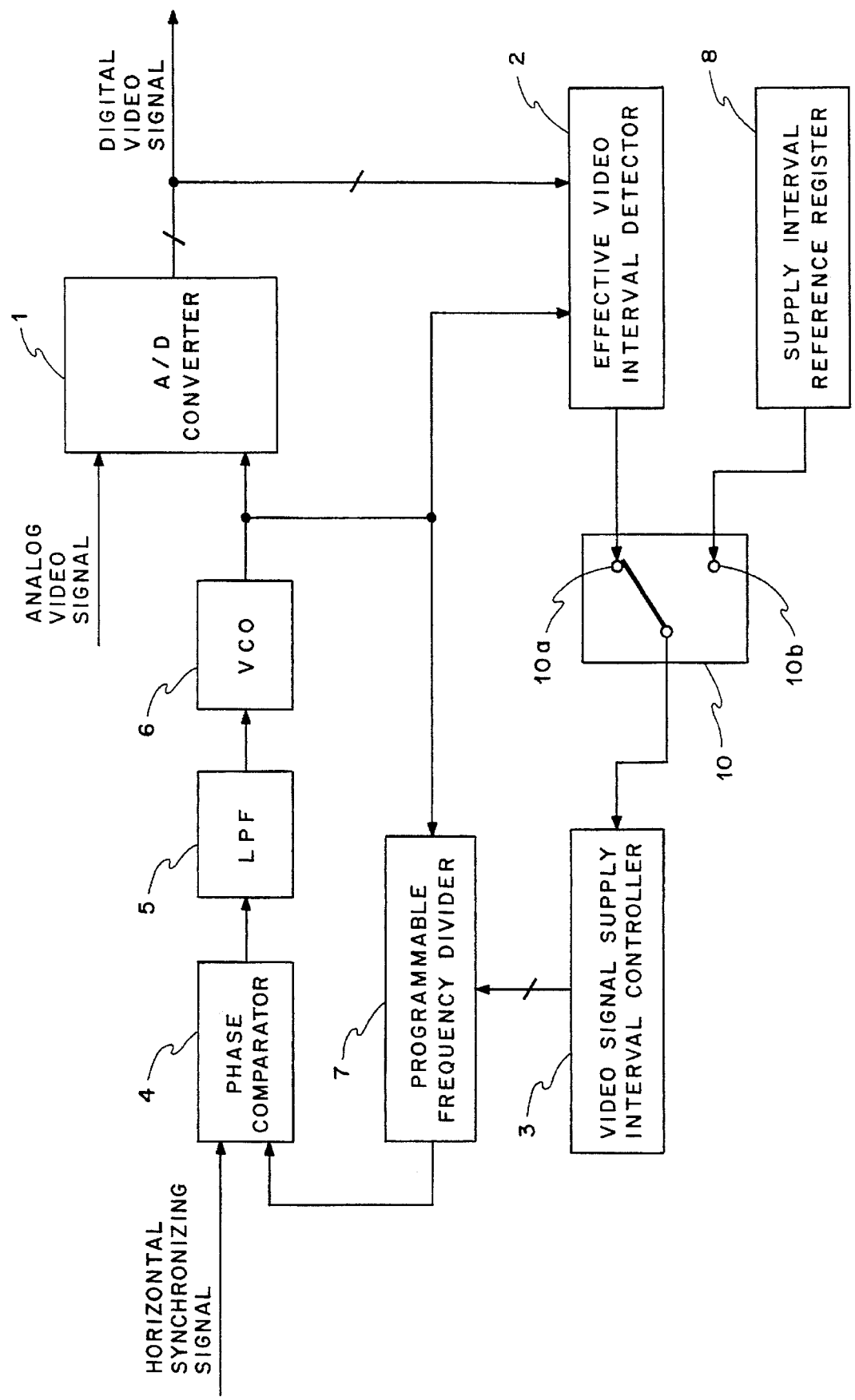
FIG. 7 is a block diagram of a video signal supplying device according to a third embodiment of the present invention.

FIG. 7 shows a video signal supplying device according to a third embodiment of the present invention. Those parts shown in FIG. 7 which are identical to those shown in FIGS. 3 and 5 are denoted by identical reference numerals, and will not be described in detail below. The video signal supplying device according to the third embodiment of the present invention resides in that it has a switch 10 connected to the input terminal of the video signal supply interval controller 3 for selecting either one of output differential data from the effective video interval detector 2 and output data from an supply interval reference register 9.

The switch 10 comprises a manual switch which can manually be operated by the user of the video signal supplying device. The supply interval reference register 9 stores a setting for determining the number of samples in an effective video interval that has externally been established.

Operation of the video signal supplying device according to the third embodiment of the present invention will be described below. A digital video signal outputted from the A/D converter 1 is supplied to the effective video interval detector 2. The effective video interval detector 2 converts the digital video signal into differential data representative of the difference between an effective video interval and a required video data interval, and supplies the differential data to a terminal 10a of the switch 10. Another terminal 10b of the switch 10 is supplied with setting data representing an supply interval from the supply interval reference register 9.

The switch 10 has its movable contact normally connected to the terminal 10a. Therefore, the output differential data from the effective video interval detector 2 is supplied through the switch 10 to the video signal supply interval controller 3. In this case, the video signal supplying device according to the third embodiment is of the same arrangement as the video signal supplying device according to the first embodiment shown in FIGS. 3 and 5. Therefore, when there is a difference between the effective video interval and the required video data interval, the frequency-dividing ratio of the programmable frequency divider 7 is corrected or varied depending on the difference for supplying video data with no difference between the effective video interval and the required video data interval.

If, however, the input analog video signal supplied to the A/D converter 1 contains noise for some reason, then the effective video interval detector 2 tends to fail to detect an effective video interval accurately, and hence differential data outputted by the effective video interval detector 2 tends to contain an error. When such differential data containing an error is supplied through the video signal supply interval controller 3 to the programmable frequency divider 7, the PLL is unable to be synchronized in phase with the horizontal synchronizing signal of the video signal, and the displayed monitor image is degraded in quality.

When the user who is monitoring the displayed monitor image notices such a degradation of the image quality, the user shifts the movable contact of the switch 10 to the terminal 10b. Therefore, the setting data outputted from the supply interval reference register 9 is supplied through the switch 10 to the video signal supply interval controller 3.

The setting data outputted from the supply interval reference register 9 corresponds to differential data representing the difference between the effective video data of the input analog video signal and the video data interval that is required by the user. When the setting data outputted from the supply interval reference register 9 is supplied to the video signal supply interval controller 3 and then supplied as frequency-dividing control data to the programmable frequency divider 7, the PLL is allowed to be continuously synchronized in phase with the horizontal synchronizing signal of the video signal, and the displayed monitor image is rendered stable.

According to the present invention, as described above, even if there is an error produced between a required video data interval and a sampled effective video interval when an input analog video signal is sampled, the frequency-dividing ratio of a variable frequency divider and a sampling clock frequency are corrected or varied based on the differential data depending on the error in order to equalize the sampled effective video interval to the required video data interval. Therefore, even if the effective video interval of an input analog video signal is varied due to a different video signal source that has been selected, it is possible to supply video data composed of a constant number of samples at all times with no error between the required video data interval and the sampled effective video interval.

According to the present invention, furthermore, an effective video interval detector is supplied with a required video data interval that has been externally established by a first setting means, i.e., the supply interval reference register, for changing the required video data interval to any value that is desired by the user. As a result, it is possible to supply video data composed of a constant number of samples.

According to the present invention, still furthermore, setting data from a second setting means, i.e., the supply interval reference register, which corresponds to the difference between a predetermined effective video interval and a required video data interval can be supplied, rather than output differential data from the effective video interval detector, through a switch to a video signal supply interval controller. If the output differential data from the effective video interval detector contains an error owing to noise or the like, the setting data from the second setting means is supplied through the switch to the video signal supply interval controller. Consequently, it is possible to supply stable image data free of any error between the required video data interval and the sampled effective video interval without being affected by noise.

While preferred embodiments of the invention have been described using specific terms, such description is for illustrative purposes only, and it is to be understood that changes and variations may be made without departing from the spirit or scope of the following claims.

What is claimed is:

1. A video signal processing device comprising:

an A/D converter means for sampling an analog video signal based on a specific sampling clock signal and converting the analog video signal into a digital video signal;

an effective video interval detector means for detecting an effective video interval of the digital video signal outputted from said A/D converter, and for outputting differential data representative of the difference between the detected effective video interval and a required video data interval;

means comprising a phase-locked loop for supplying said A/D converter with a signal, as the specific sampling clock signal, which is synchronized in phase with a horizontal synchronizing signal separated from said analog video signal and supplied from a voltage-controlled oscillator whose output frequency is variably controlled based on a phase difference between said horizontal synchronizing signal and an output signal from a variable frequency divider, and feeding said signal back to said variable frequency divider; and a video signal supply interval controller means supplied with said differential data and outputting frequency-dividing ratio data to establish a frequency-dividing ratio for said variable frequency divider to decrease to zero said differential data in said phase-locked loop.

2. A video signal processing device according to claim 1, further comprising first setting means for externally establishing and supplying the required video data interval to said effective video interval detector.

3. A video signal processing device according to claim 1, further comprising second setting means for outputting setting data corresponding to a difference between a predetermined effective video interval and the required video data interval, and a switch for selecting one of the differential data from said effective video interval detector and said setting data and outputting said selected one of the data to said video signal supply interval controller.

4. A video signal processing device according to any one of claims 1 through 3, wherein said effective video interval detector comprises:

a first comparator means for being supplied with the digital video signal from said A/D converter, for comparing the supplied digital video signal with a reference level, and for outputting a status signal indicative of whether the digital video signal belongs to an effective video signal region or a non-video signal region;

a counter means for counting a number of samples in the effective video interval based on said status signal from said first comparator and the signal supplied from the voltage-controlled oscillator in said phase-locked loop; and a comparator for outputting differential data which is indicative of a difference between the count of said counter and said required video data interval.

5. A video signal processing device according to any one of claims 1 through 3, wherein said video signal supply interval controller comprises:

a storage circuit means for outputting the frequency-dividing ratio data to establish the frequency-dividing ratio for said variable frequency divider; and a calculating circuit means supplied with said differential data, calculating a new frequency-dividing ratio control data based on the differential data and previous frequency-dividing ratio control data read out from said storage circuit, and supplying the calculated result as a preset frequency-dividing ratio control data to said storage circuit.

* * * * *